United States Patent [19]

Segawa

[11] Patent Number: 5,097,448
[45] Date of Patent: Mar. 17, 1992

[54] SEMICONDUCTOR MEMORY DEVICE CAPABLE OF RELIEVING DEFECTIVE BITS

[75] Inventor: Makoto Segawa, Yokohama, Japan

[73] Assignee: Kabushiki Kaisha Toshiba, Kawasaki, Japan

[21] Appl. No.: 405,885

[22] Filed: Sep. 11, 1989

[30] Foreign Application Priority Data

Sep. 12, 1988 [JP] Japan .................. 63-228058

[51] Int. Cl.[5] .................. G11C 7/00; G11C 29/00
[52] U.S. Cl. .................................. 365/200; 365/227
[58] Field of Search ............... 365/200, 227, 189.06, 365/156

[56] References Cited

U.S. PATENT DOCUMENTS

| | | | |
|---|---|---|---|
| 4,233,672 | 11/1980 | Suzuki et al. | 365/181 |
| 4,587,638 | 5/1986 | Isobe et al. | 365/200 |
| 4,639,895 | 1/1987 | Iwahashi et al. | 365/200 |
| 4,685,086 | 8/1987 | Tran | 365/200 |
| 4,780,851 | 10/1988 | Kurakami | 365/200 |
| 4,858,182 | 8/1989 | Pang et al. | 365/156 |

FOREIGN PATENT DOCUMENTS

| | | |
|---|---|---|
| 0186175 | 7/1986 | European Pat. Off. . |
| 0195412 | 9/1986 | European Pat. Off. . |
| 0095721 | 12/1986 | European Pat. Off. . |

OTHER PUBLICATIONS

IBM Technical Disclosure Bulletin, vol. 25, No. 6, Nov. 1982, CMOS Static Random-Access Memory Layout, J. A. Hiltebeitel, pp. 3120-3122.

Primary Examiner—Stuart N. Hecker
Assistant Examiner—Michael A. Whitfield
Attorney, Agent, or Firm—Finnegan, Henderson, Farabow, Garrett, and Dunner

[57] ABSTRACT

A memory cell array includes static memory cells arranged in an array of n rows × m columns. Each of the memory cells includes MOS transistors formed in a semicondutor substrate and in a corresponding one of well regions of the conductivity type opposite to that of the semiconductor substrate. The well regions are independently formed for each row or for every two or more rows of the memory cell array. The well regions are connected to the respective sources of MOS transistors formed in the well regions. The source and backgate of each of the MOS transistors formed in the well regions are connected to the common source wirings for each of the independently formed well regions. Isolation circuits are respectively connected between the common source wirings for the repective well regions and the power source. A row of the memory cell array to which a defective memory cell is connected is isolated from the power source by means of the isolation circuits.

10 Claims, 12 Drawing Sheets

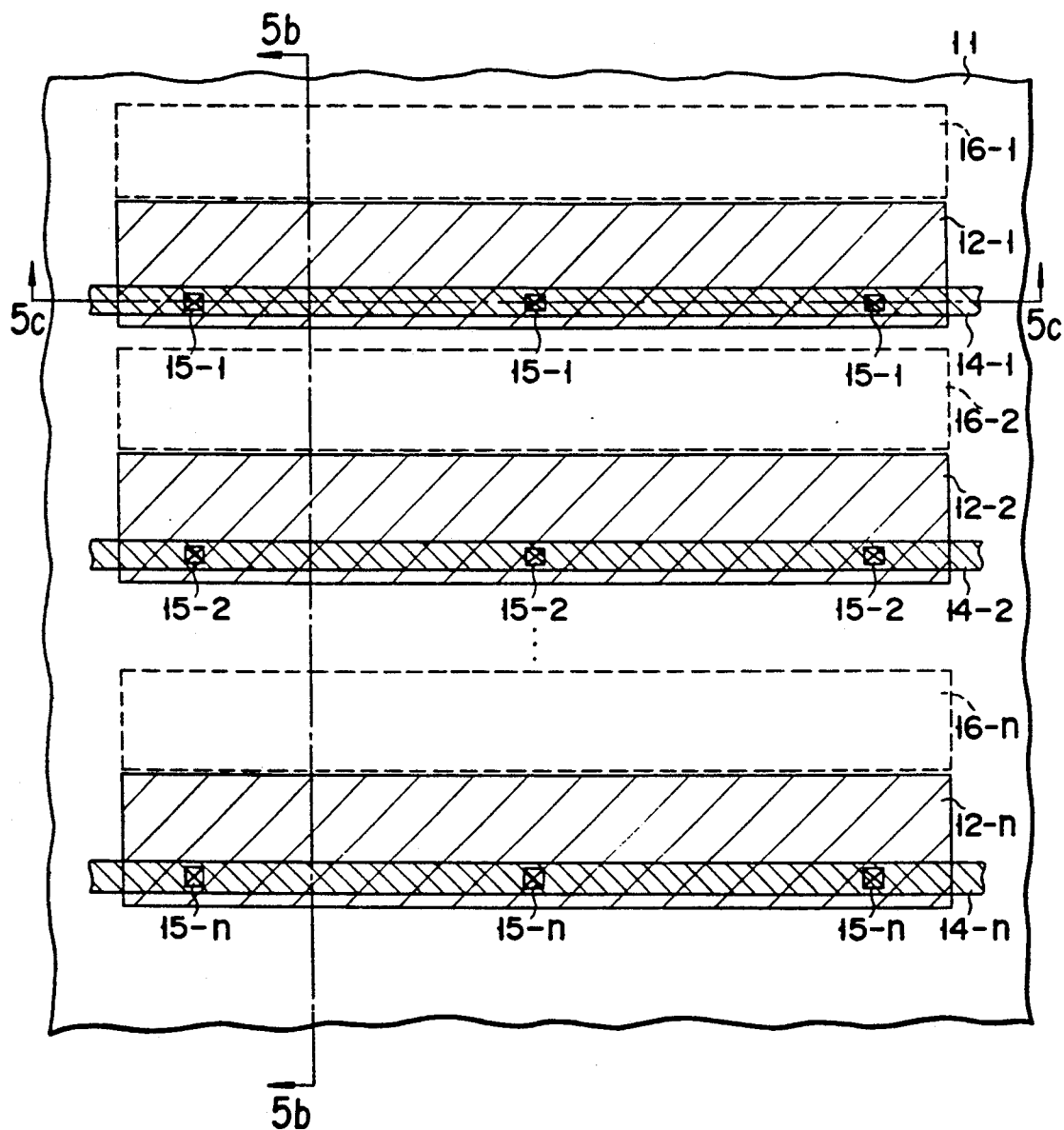
F I G. 5A

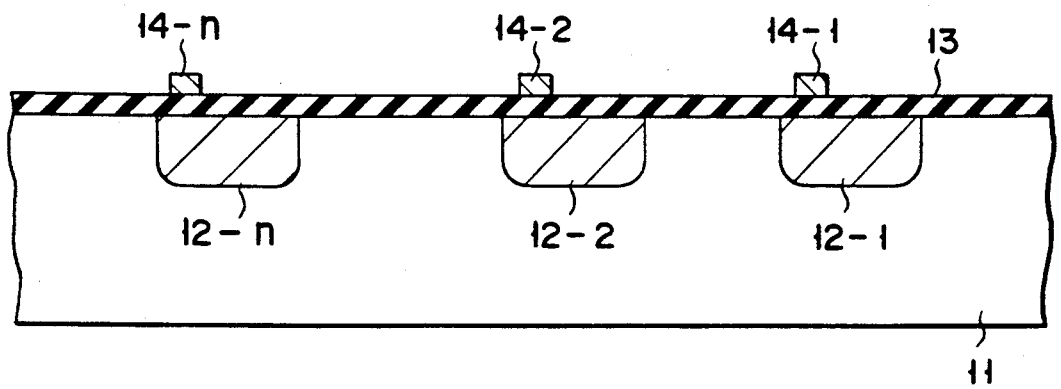
F I G. 5B
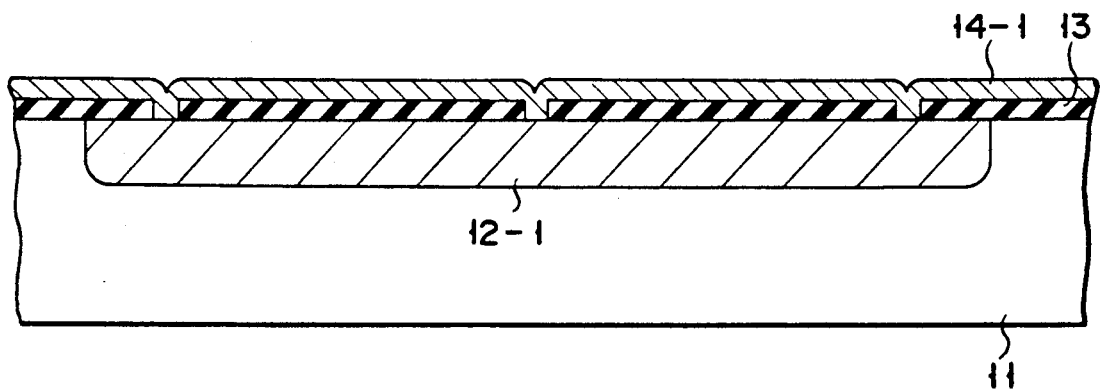
F I G. 5C

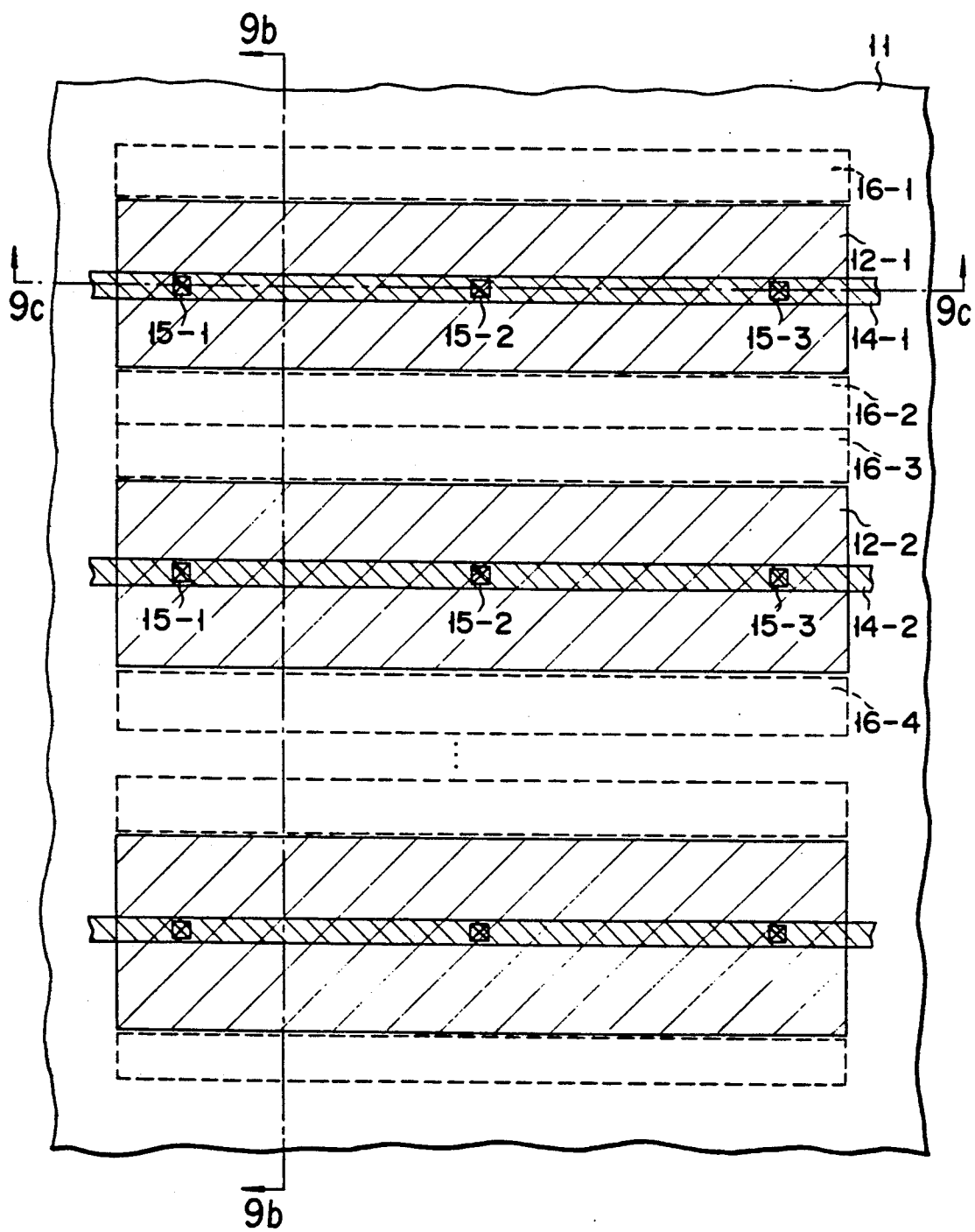
F I G. 9A

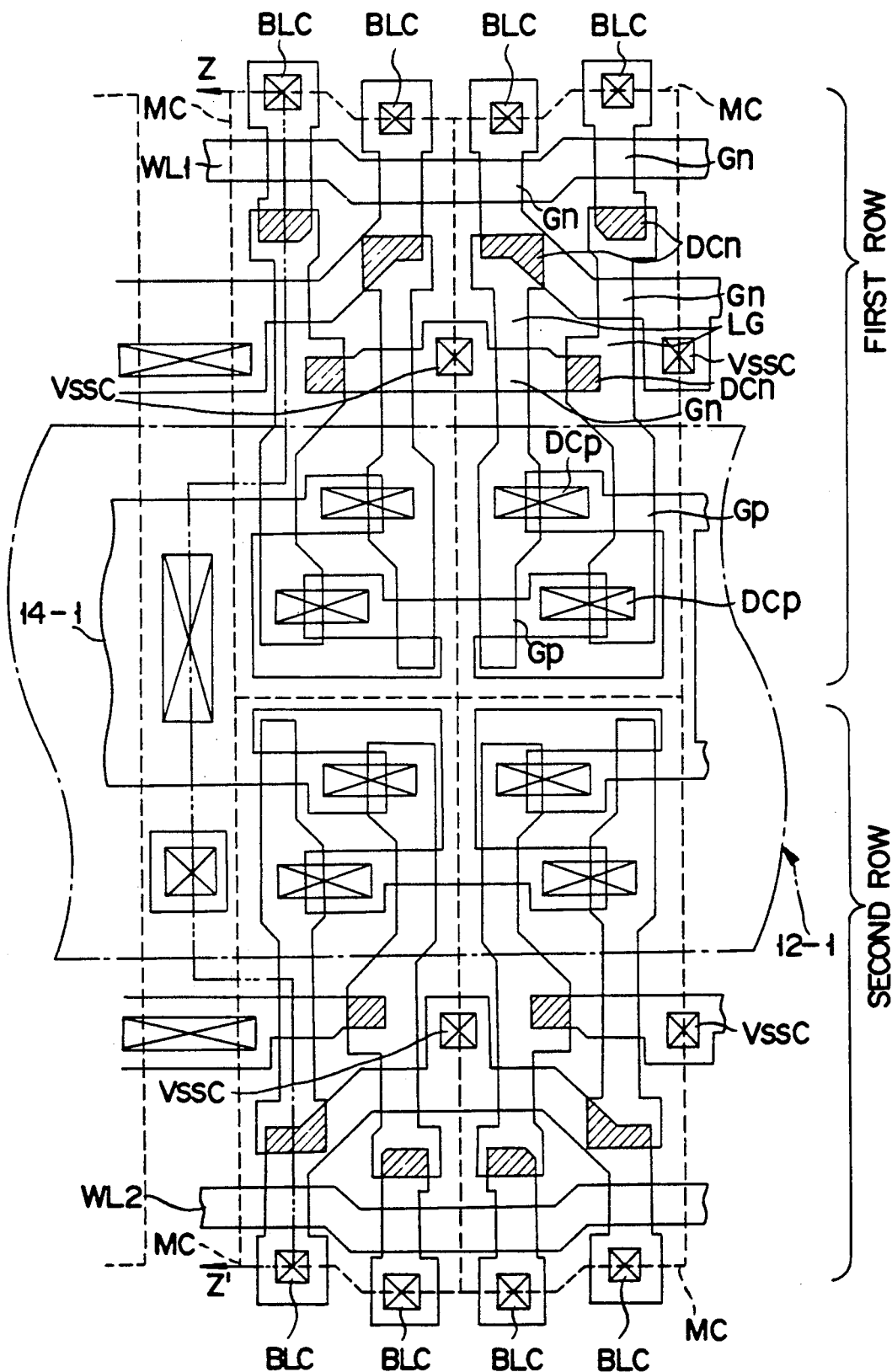
F I G. 10A

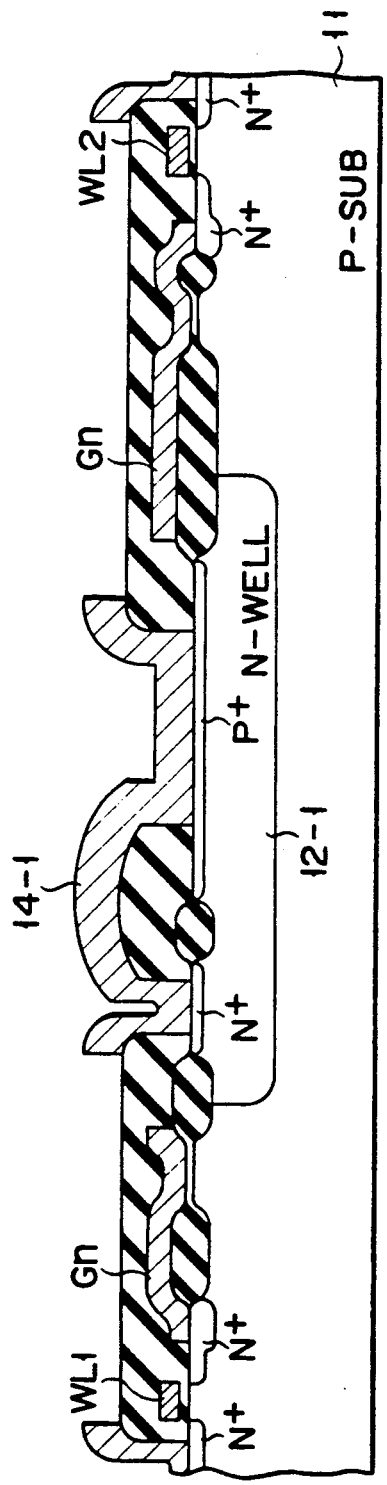
F I G. 10B

SEMICONDUCTOR MEMORY DEVICE CAPABLE OF RELIEVING DEFECTIVE BITS

BACKGROUND OF THE INVENTION

1. Field of the Invention

This invention relates to a semiconductor memory device, and more particularly to the technique of relieving defective bits in a static random access memory (RAM).

2. Description of the Related Art

With the development of fine pattern technology, the integration density of MOS type memory devices is further enhanced and the memory capacity has reached 1 Mbits in the static RAM. However, in this case, the rate of occurrence of defective bits resulting from dust, patterning error, crystal defects and the like caused in the manufacturing process becomes higher, lowering the manufacturing yield. Therefore, it becomes indispensable to further develop the technique of relieving the defective bits in order to solve the above problem.

The method of relieving the defective bits i attained by preparing spare memory cells and replacing defective memory cells by the spare memory cells. FIG. 1 is a block diagram of the conventional semiconductor memory device capable of relieving defective bits. Memory cells in a regular memory cell array 81 of n rows×m columns are selected by means of a regular row decoder 86 and a regular column decoder 87. For the regular memory cell array 81, a spare row section (spare memory cell row section) 82 of several rows or a spare column section (spare memory cell column section) 83 of several columns are provided and a spare row decoder 84 for selecting the spare row section or a spare column decoder 85 for selecting the spare column section is provided. The same address as that of the row or column in which defective bits occur can be programmed into the spare row decoder 84 or spare column decoder 85. The address programming operation is effected by blowing off a fuse connected thereto with a laser beam, for example. Further, the memory device includes a circuit (not shown) for generating a signal which inhibits the defective row or defective column of the regular memory cell array 81 from being selected in a case where the spare row section 82 or spare column section 83 is selected. With this technology, the manufacturing yield can be enhanced by replacing the row or column including the defective bits by the spare row or column.

As described above, the row or column including the defective bits may be replaced by the spare row or spare column. At this time, the row or column including the defective bits may be disconnected from the power source as shown in FIG. 2. That is, a fuse 92 is inserted between a power source line 91 of memory cells 90 and a power source Vcc, and if a defective bit occurs in at least one of the memory cells 90 connected to the power source line 90, causing a leak current, then the fuse 92 is blown off with a laser beam to disconnect the defective bit from the power source Vcc. As a result, even if a leak current occurs in the defective bit, the current can be interrupted.

In the static RAM, the memory cell 90 is constructed as shown in FIG. 3, for example. That is, the memory cell includes a first CMOS inverter IN1 which is constructed by a driving N-channel MOS transistor T1 and a load P-channel MOS transistor T3, a second CMOS inverter IN2 which is constructed by a driving N-channel MOS transistor T2 and a load P-channel MOS transistor T4, and two transfer N-channel MOS transistors T5 and T6. The output terminal and input terminal of the first CMOS inverter IN1 are respectively connected to the input terminal and output terminal of the second CMOS inverter IN2 to form a flip-flop FF. The current path of the transfer MOS transistor T5 is connected between the output terminal of the first CMOS inverter IN1 and a bit line BL. Likewise, the current path of the transfer MOS transistor T6 is connected between the output terminal of the second CMOS inverter IN2 and a bit line $\overline{BL}$. Further, the gates of the transfer MOS transistors T5 and T6 are connected to a word line WL.

In the static RAM using the memory cell shown in FIG. 3, a through current may flow between the power sources Vcc and Vss of the memory cell only in the transient time during which the output of the flip-flop FF is being inverted. Therefore, an advantage that the current consumption in the standby mode can be suppressed to a minimum can be attained.

However, in a case where a leak current flows in at least one of a large number of memory cells of the static RAM, the current consumption in the standby mode increases even if the function of the memory cell is not affected. In this case, the above advantage cannot be attained. In order to solve this problem, a technology of interrupting the leak current occurring in the defective bit as shown in FIG. 2 can be effectively used.

Next, how the leak current occurs in the memory cell of the circuit construction shown in FIG. 3 is explained. FIG. 4 shows the cross section of a semiconductor device including the N-channel MOS transistor T1 and P-channel MOS transistor T3 constituting the CMOS inverter IN1 arranged in the memory cell of FIG. 3 formed in the silicon substrate. Element isolation regions 101 are selectively formed on the main surface of a P-type silicon substrate 100 to form element regions. The source and drain regions 102 and 103 of the N-channel MOS transistor T1 formed of N-type high impurity concentration diffusion layers are formed in the surface area of the element region of the silicon substrate 100. Further, a gate electrode 104 is formed on a gate insulation film (not shown) which is in turn disposed on a channel region formed between the source and drain regions 102 and 103. An N-well region 105 is formed in part of the silicon substrate 100. Source and drain regions 106 and 107 of P-channel MOS transistor T3 formed of P-type high impurity concentration diffusion layers are formed in the surface area of the element region of the N-well region 105. Further, a gate electrode 108 is formed on a gate insulation film (not shown) which is in turn disposed on a channel region formed between the source and drain regions 106 and 107.

The N-well region 105 and the source region 106 of the MOS transistor T3 are connected to the power source Vcc and the silicon substrate 100 and the source 102 of the MOS transistor T1 are connected to the power source Vss (ground potential). The drain regions 103 and 107 of the MOS transistors T1 and T3 are connected together by means of a wiring 109 and the gate electrodes 104 and 108 of the MOS transistors T1 and T3 are connected together by means of a wiring 110. In this case, the equivalent circuit paths for the leak current are indicated by resistors R1 to R11.

The method for interrupting the leak current explained with reference to FIG. 2 is effective for the leak current flowing through those paths R1 to R4, R6 and R7 among the leak current paths R1 to R11. However, there still remains a problem that it is impossible to interrupt the leak current caused by the N-well region 105 and flowing in the remaining leak current paths R5 and R8 to R11.

SUMMARY OF THE INVENTION

Accordingly, an object of this invention is to provide a semiconductor memory device in which the leak current occurring in defective bits can be interrupted even if it occurs in the leak current path created by the well region, and the defective bits can be relieved by replacing the defective bits by spare bits.

The above object can be attained by a semiconductor memory device comprising a semiconductor substrate of a first conductivity type; a plurality of well regions of a second conductivity type which are independently formed in the semiconductor substrate; a memory cell array having a plurality of memory cells each formed of MOS transistors of the first conductivity type and MOS transistors of the second conductivity type and arranged in an array form, the first conductivity type MOS transistors in each row being formed in one of the plurality of well regions and the second conductivity type MOS transistors being formed in the semiconductor substrate a plurality of common source wirings respectively connected to the well regions and each connected commonly to the sources of those of the MOS transistors which are formed in a corresponding one of the independently formed well regions; and an isolation circuit connected between the common source wirings and a power source, for isolating the well region in which a row including a defective memory cell is formed from the power source, or a switching circuit for selectively supplying one of a power source potential and a potential of the semiconductor substrate to the common source wirings.

A potential different from that of the semiconductor substrate is applied to the common source wirings ( and thereby to the well regions) on the row including no defective memory cell via the isolation circuit or switching circuit so as to operate the memory cells on the row in a normal operation mode. In contrast, in the row in which at least one defective memory cell is formed and a leak current occurs, the common source wirings are isolated from the power source by means of the isolation circuit or applied with the same potential as that of the semiconductor substrate by means of the switching circuit. Therefore, the leak current can be prevented from flowing in the defective memory cell. The defective bit can be relieved by replacing the defective row by a spare row.

In this way, a semiconductor memory device can be provided in which the leak current occurring in the defective bit can be interrupted even if it occurs in the leak current path related to the well region and the defective bit can be relieved by replacing the defective bit by a spare bit.

BRIEF DESCRIPTION OF THE DRAWINGS

FIG. 5A is a pattern plan view showing a semiconductor substrate, well regions and wirings for the well regions in a semiconductor memory device according to a first embodiment of this invention;

FIG. 5B is a cross sectional view taken along line X—X' of the pattern shown in FIG. 5A;

FIG. 5C is a cross sectional view taken along line Y—Y' of the pattern shown in FIG. 5A;

FIG. 9A is a pattern plan view showing a semiconductor substrate, well regions and wirings for the well regions in a semiconductor memory device according to a fifth embodiment of this invention;

FIG. 10A is a pattern plan view more specifically showing part of the pattern of FIG. 9A; and FIG. 10B is a cross sectional view taken along line Z—Z' of the pattern shown in FIG. 10A.

DETAILED DESCRIPTION OF THE PREFERRED EMBODIMENTS

Figure 1:
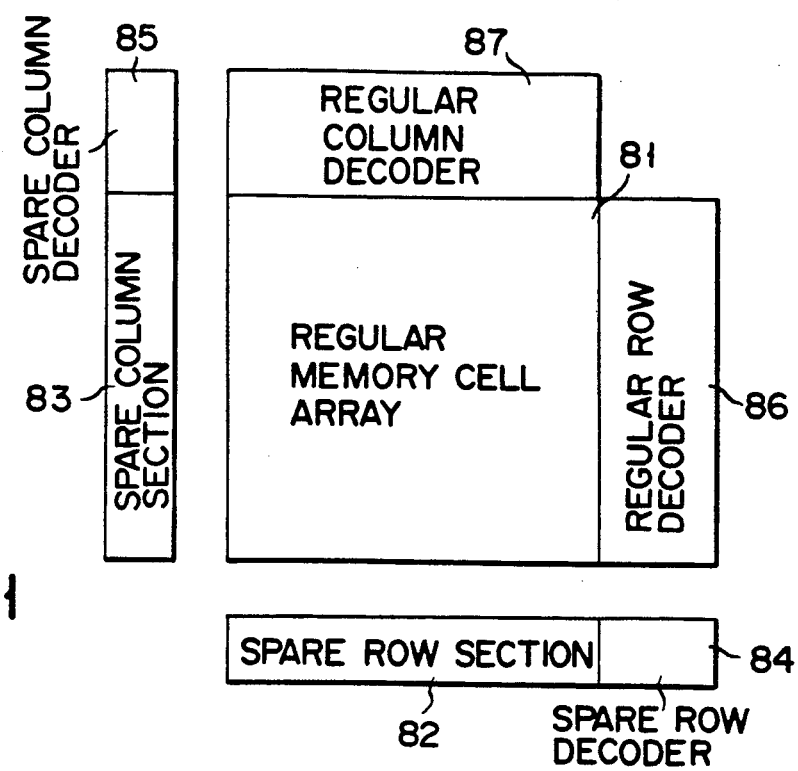
FIG. 1 is a block diagram showing the ordinary construction of the conventional semiconductor memory device having a defective bit relieving means.
Figure 2:
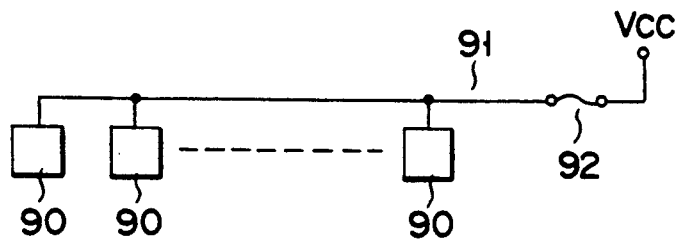
FIG. 2 is a circuit diagram showing one example of the conventional defective bit relieving means of the memory device shown in FIG. 1.
Figure 3:
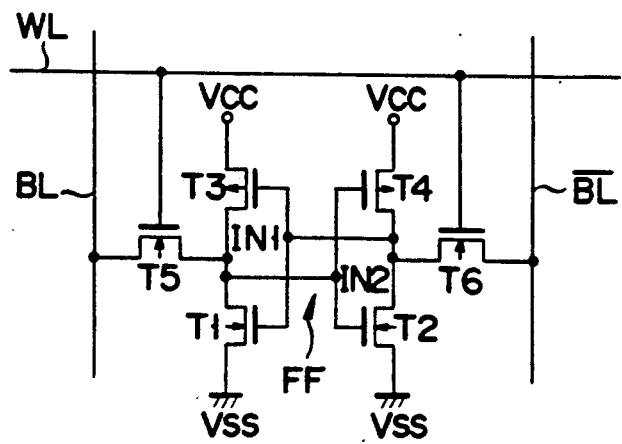
FIG. 3 is a circuit diagram showing the construction of the conventional static memory cell used in the memory device shown in FIGS. 1 and 2.
Figure 4:
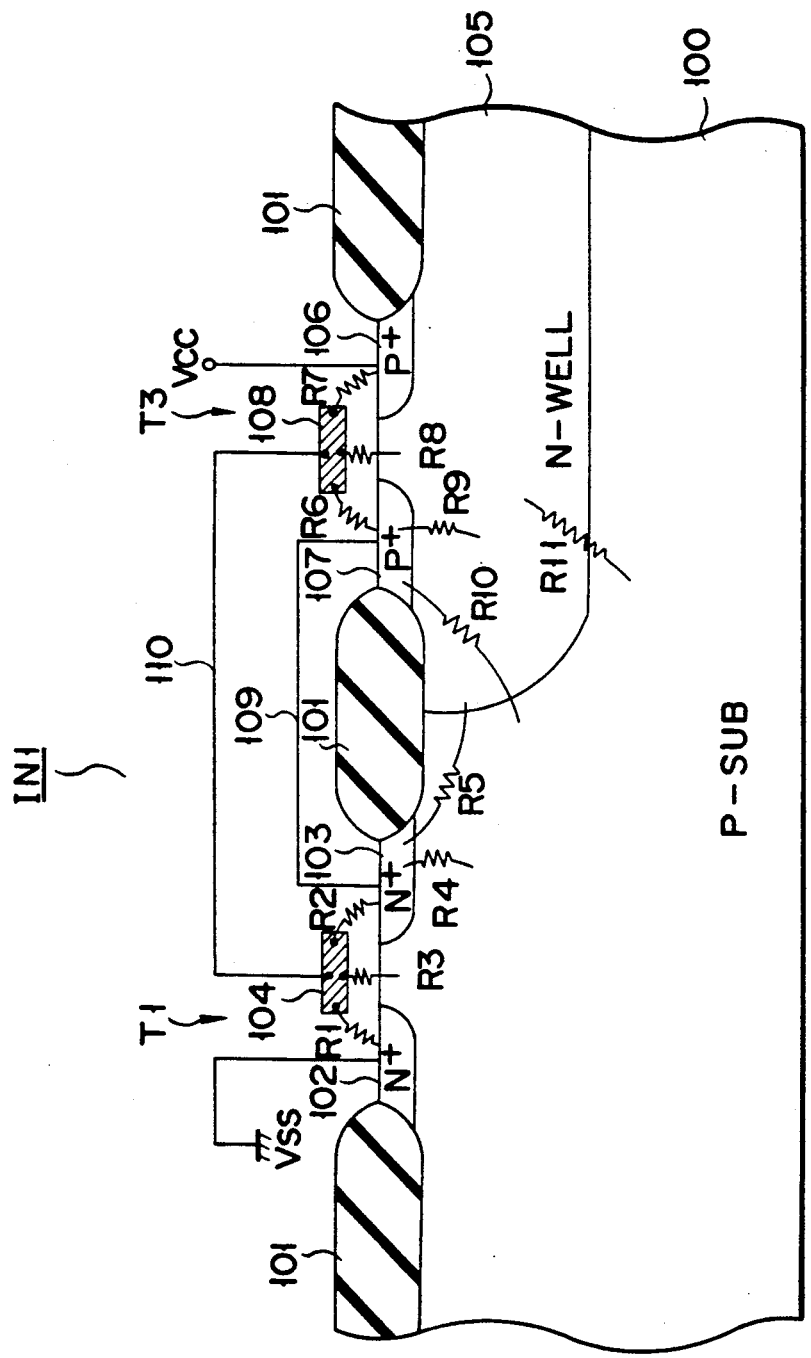
FIG. 4 is a cross sectional view showing a CMOS pattern section of the memory cell shown in FIG. 3.
Figure 5D:
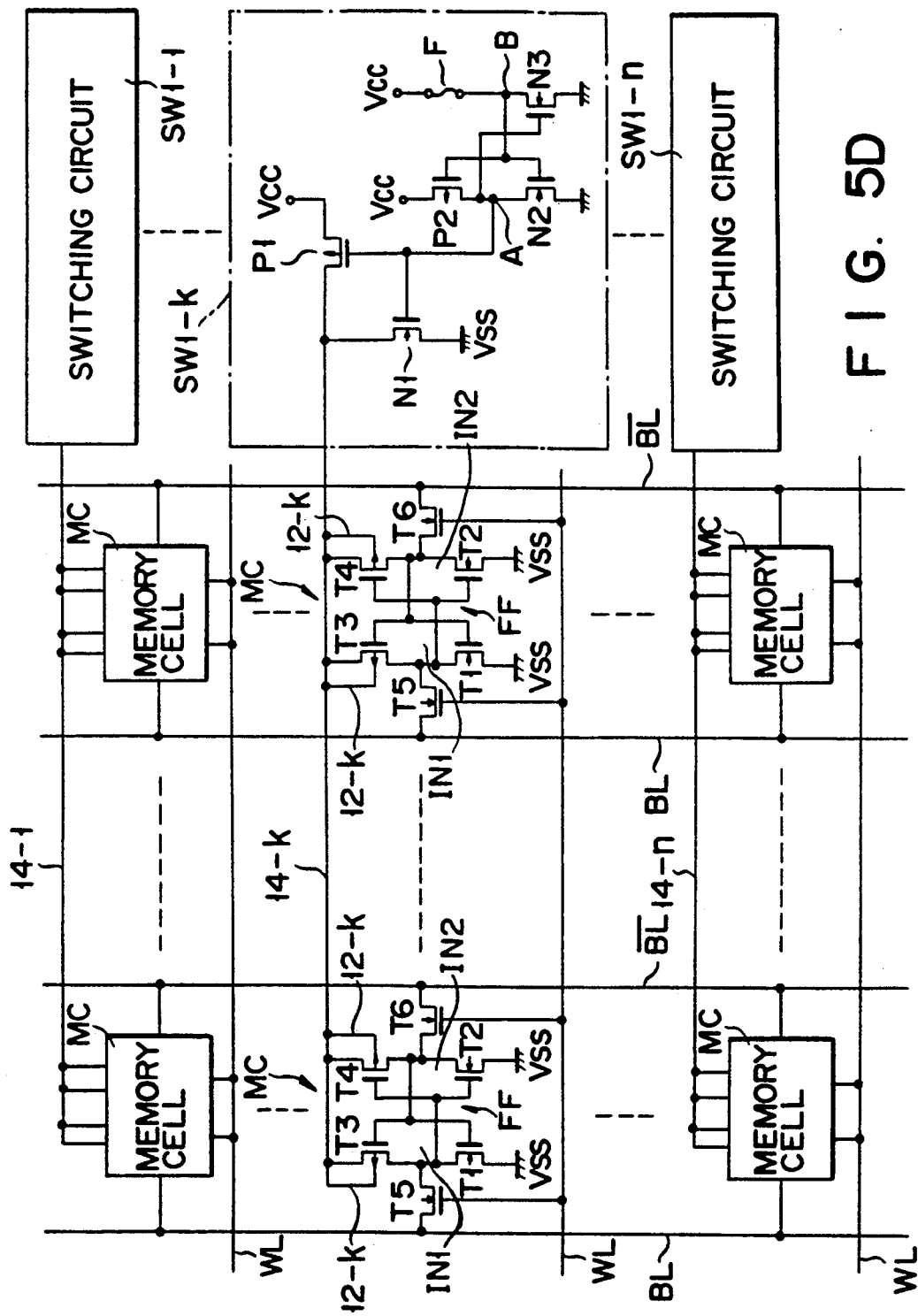
FIG. 5D is a circuit diagram showing a memory cell array in the semiconductor memory device according to the first embodiment of this invention.

FIGS. 5A to 5D show a semiconductor memory device according to a first embodiment of this invention. FIG. 5A is a pattern plan view, FIG. 5B is a cross sectional view taken along line X—X' of FIG. 5A, FIG. 5C is a cross sectional view taken along line Y—Y' of FIG. 5A, and FIG. 5D is a circuit diagram showing the memory cell array. It should be noted that a semiconductor substrate, well regions and wirings for the well regions which are directly related to this invention are extracted and schematically shown in FIGS. 5A to 5C and semiconductor elements, wirings for the semiconductor elements and isolation regions are omitted for brevity of the drawing. Further, in FIG. 5D, memory cells on the k-th row of the memory cell array are shown in detail and memory cells on the other rows are shown in the block form.

A plurality of N-type well regions 12-1, 12-2, ---, 12-n are formed in the stripe form at a regular interval in the main surface area of P-type semiconductor substrate (silicon substrate) 11. The well regions 12-1, 12-2, ---, 12-n are independently formed for each row of the memory cells in the memory cell array. Further, in the main surface of the semiconductor substrate 11, an insulation film 13 is formed. Common source wirings 14-1, 14-2, ---, 14-n formed of aluminum, for example, are formed on those portions of insulation film 13 which correspond in position to well regions 12-1, 12-2, ---, 12-n. A plurality of contact holes 15-1, 15-2, ---, 15-n are respectively formed in those portions of insulation film 13 which lie under the common source wirings 14-1, 14-2, ---, 14-n. The common source wirings 14-1, 14-2, ---, 14-n are electrically connected to the respective well regions 12-1, 12-2, ---, 12-n via the contact holes 15-1, 15-2, ---, 15-n.

N-channel MOS transistors T1, T2, T5 and T6 of memory cells MC in the circuit of FIG. 5D are formed in each of regions 16-1, 16-2, ---, 16-n on the surface of the semiconductor substrate 11 of the pattern shown in FIG. 5A and surrounded by broken lines. Further, P-channel MOS transistors T3 and T4 of the memory cells MC are formed in each of the well regions 12-1, 12-2, ---, 12-n which are disposed adjacent to the regions 16-1, 16-2, ---, 16-n. That is, the MOS transistors T1, T2, T5 and T6 in the memory cells MC on the same row are formed in each of the regions surrounded by the broken lines and the MOS transistors T3 and T4 of the memory cells MC on the same row are formed in each of the well regions. In FIG. 5D, the connection with respect to the well region is indicated by attaching a reference numeral of the well region 12-k to the back-gate portion of the MOS transistors T3 and T4.

Each of the memory cells MC is formed of first and second CMOS inverters IN1 and IN2 and two transfer N-channel MOS transistors T5 and T6. The first CMOS inverter IN1 includes a driving N-channel MOS transistor T1 and a load P-channel MOS transistor T3. The source of the MOS transistor T1 is connected to the ground terminal Vss, the drain thereof is connected to the drain of the MOS transistor T1 and the gate thereof is connected to the gate of the MOS transistor T3. The source and back-gate of the MOS transistor T3 are connected to the common source wiring 14-k. Likewise, the second CMOS inverter IN2 includes a driving N-channel MOS transistor T2 and a load P-channel MOS transistor T4. The source of the MOS transistor T2 is connected to the ground terminal Vss, the drain thereof is connected to the drain of the MOS transistor T3 and the gate thereof is connected to the gate of the MOS transistor T3. The source and back-gate of the MOS transistor T4 are connected to the common source wiring 14-k. The input and output terminals of th first CMOS inverter IN1 are respectively connected the output and input terminals of the second CMOS inverter IN2 so as to form a flip-flop FF. The current path of the transfer MOS transistor T5 is connected between the output terminal of the first CMOS inverter IN1 and a bit line BL and the current path of the transfer MOS transistor T6 is connected between the output terminal of the second CMOS inverter IN2 and a bit line $\overline{BL}$. Further, the gates of the MOS transistors T5 and T6 are connected to a word line WL.

The sources of the load P-channel MOS transistors T3 and T4 in each of the memory cells MC on the same row are connected to a corresponding one of the common source wirings 14-1, ---, 14-k, ---, 14-n. As shown in FIGS. 5A and 5C, since the well regions 12-1, 12-2, ---, 12-n are respectively connected to the common source wirings 14-1, ---, 14-k ---, 14-n via the contact holes 15-1, 15-2, ---, 15-n, the back-gates of the MOS transistors T3 and T4 are connected to the same one of the common source wirings 14-1, ---, 14-k, ---, 14-n for each row in the equivalent circuit.

Switching circuits SW1-1, ---, SW1-k, ---, SW1-n are connected to one-side ends of the common source wirings 14-1, ---, 14-k ---, 14-n. The switching circuits SW1-1, ---, SW1-k ---, SW1-n are used to selectively supply a potential of power source Vcc or a potential of the ground terminal Vss to the common source wirings 14-1, -- , 14-k, ---, 14-n. Each of the switching circuits SW1-1, ---, SW1-k, ---, SW1-n includes P-channel MOS P1 and P2, N-channel MOS transistors N1 to N3 and a fuse F. The construction of the switching circuits SW1-1, ---, SW1-k, ---, SW1-n is now explained by taking the switching circuit SW1-k as an example. The current path of the MOS transistor P1 is connected between one end of the common source wiring 14-k and the power source Vcc. Further, the current path of the N-channel MOS transistor N1 is connected between one end of the common source wiring 14-k and the ground terminal Vss. The gates of the MOS transistors P1 and N1 are connected together and the gate common connection node A is connected to the drains of MOS transistors P2 and N2. The source of the MOS transistor P2 is connected to the power source Vcc, the source of the MOS transistor N2 is connected to the ground terminal Vss, and the gates of the MOS transistors P2 and N2 are connected together. The fuse F is connected between the gate common connection node B of the MOS transistors P2 and N2 and the power source Vcc. The current path between the source and drain of the MOS transistor N3 is connected between the connection node B and the ground terminal Vss and the gate of the MOS transistor N3 is connected to the connection node A. The other switching circuits have the same construction as that described above.

In a case where there is no defective memory cell in the memory cell each of the fuses F in the switching circuits SW1-1, ---, SW1-k, ---, SW1-n is kept connected. Therefore, n this case, the connection node B is set to the potential of the power source Vcc and the MOS transistors N2 and P2 are respectively turned on and off, thereby setting the connection node A to the potential of the ground terminal Vss. As a result, the MOS transistors P1 and N1 are respectively turned on and off and the common source wirings 14-1, ---, 14-k, ---, 14-n on each row are set to the potential of the power source Vcc, causing the memory device to operate normally.

In contrast, in a case where it is detected that at least one defective memory cell occurs in a row (for example, k-th row) of the memory cell array and a leak current flows, the fuse F in the switching circuit SW1-k on the k-th row is blown off by application of a laser beam, for example. As a result, the potential of the connection node B is lowered, and the MOS transistors P2 and N2 in the switching circuit are respectively turned on and off, setting the connection node A to the potential of the power source Vcc. Consequently, the MOS transistor N3 is turned on and the connection node B is set to a potential of the ground terminal Vss. Therefore, the MOS transistors P1 and N1 are respectively turned off and on and the common source wiring on the row is set to the potential of the ground terminal Vss. As a result, since all the memory cells MC on the defective row or k-th row are completely isolated from the power source Vcc, flow of the leak current is prevented. Further, the defective bit is relieved by replacing the defective row (k-th row) by a spare row which is previously prepared.

Figure 6:
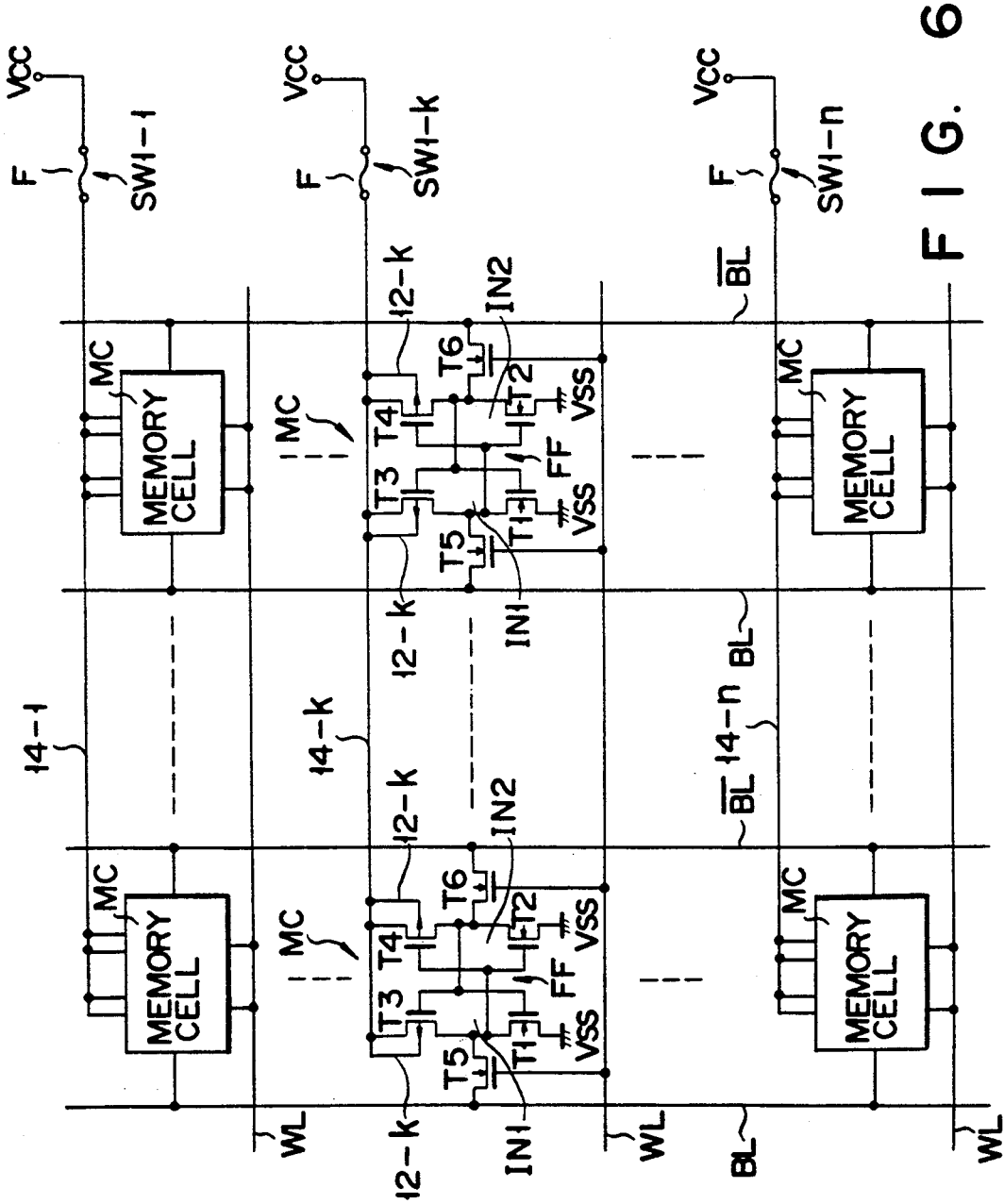
FIGS. 6 to 8 are circuit diagrams respectively showing memory cell arrays of semiconductor memory devices according to second to fourth embodiments of this invention.

The switching circuits SW1-1, ---, SW1-k, ---, SW1-n are provided to prevent problems from occurring in a case where the common source wiring 14-1, ---, 14-k, ---, or 14-n, that is, well regions 12-1, 12-2, ---, or 12-n on a row in which the leak current flows is set in the electrically floating state. However, if no problem occurs even in the above case, it is possible to provide only fuses F as the switching circuits SW1-1, ---, SW1-k, ---, SW1-n as shown in FIG. 6 which shows the second embodiment of this invention. That is, the fuses F are connected between the common source wirings 14-1, ---, 14-k, ---, 14-n and the power source Vcc.

In the memory cell array shown in FIG. 6, if there is no defective row, all the fuses F are kept connected and the common source wirings 14-1, ---, 14-k, , 14-n on all the rows are kept at the potential of the power source Vcc. In contrast, if it is detected that a defective cell occurs and a leak current flows in a row, for example, a laser beam is applied to blow off the fuse F. As a result, since all the memory cells MC connected to the defective row in which the fuse F is blown off are completely separated from the power source Vcc, no leak current flows in the defective row.

Figure 7:
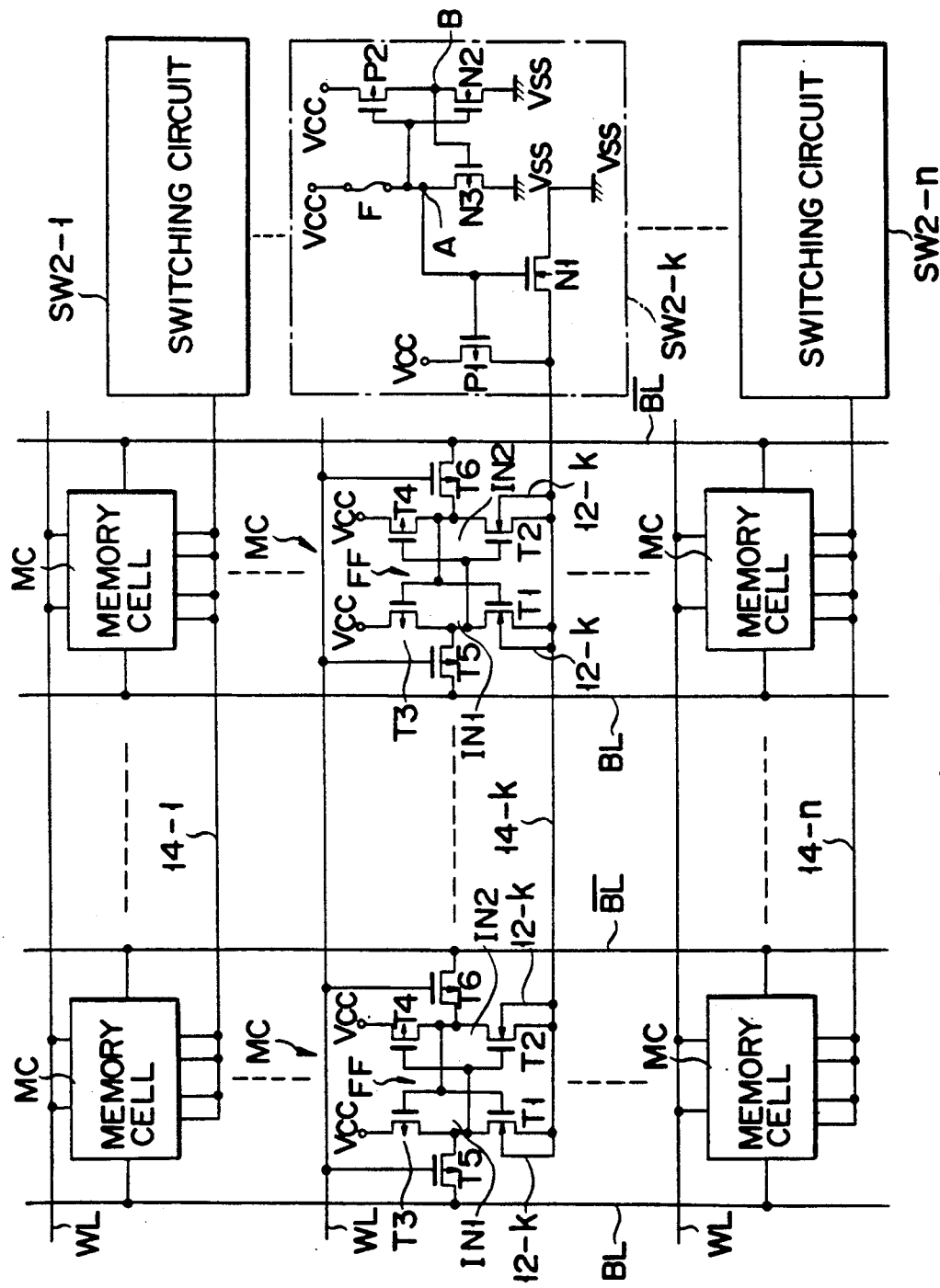
Figure 8:
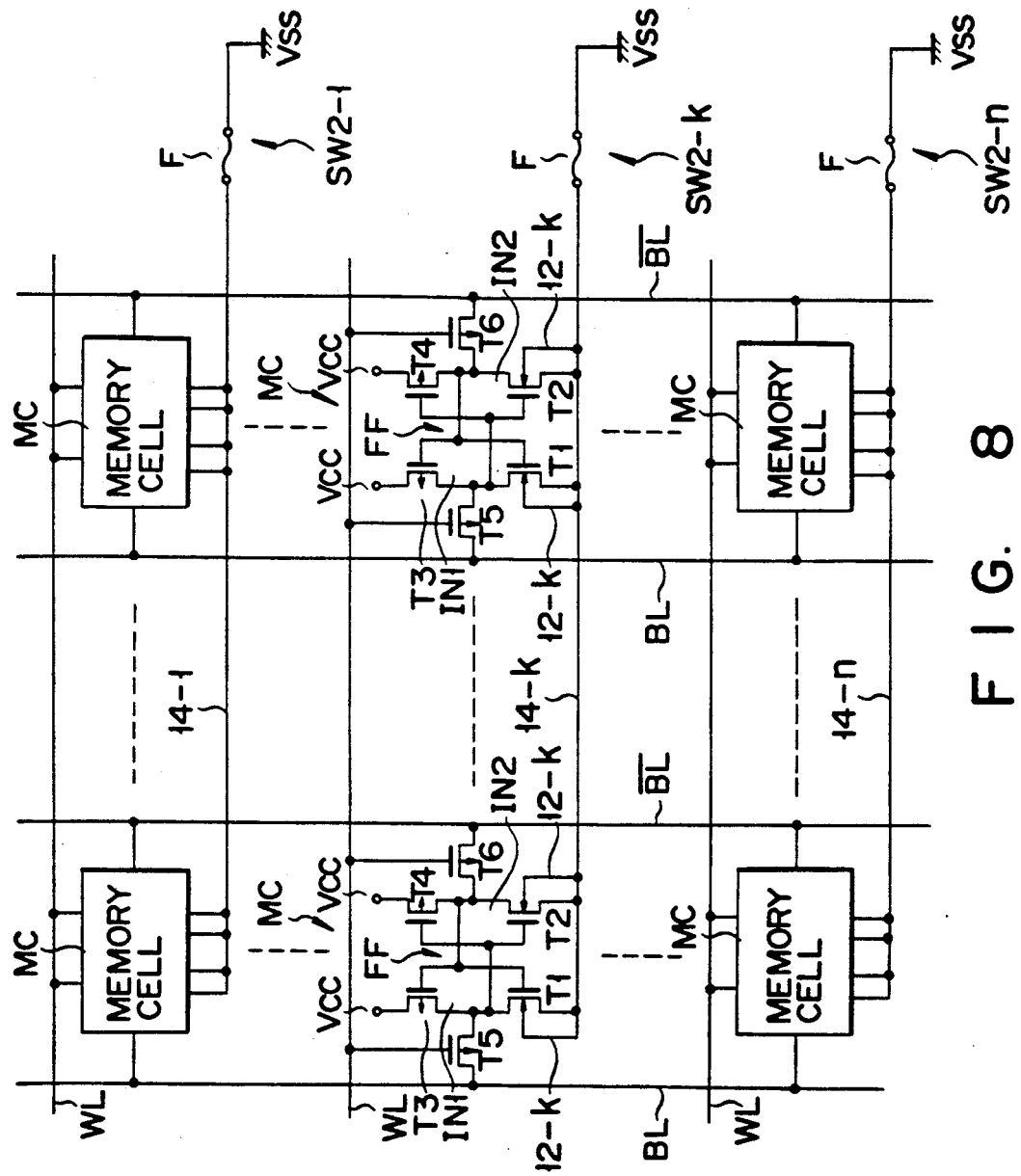

FIGS. 7 and 8 show the memory cell arrays of semiconductor memory devices according to the third and fourth embodiments of this invention. In the first and second embodiments, the memory device is formed by use of the P-type silicon substrate. However, in the circuits of FIGS. 7 and 8, an N-type silicon substrate is used to form a static RAM.

The memory devices are similar to those of the first and second embodiments except that the conductivity types of the semiconductor regions are inverted. That is, the P-type semiconductor substrate 11 in FIGS. 5A to 5c is replaced by an N-type semiconductor substrate, N-type well regions 12-1, 12-2, ---, 12-n are replaced by P-type well regions, P-channel MOS transistors T3 to T6 are formed in the surface area of the semiconductor substrate 11 and N-channel MOS transistors T1 and T2 are formed in the well regions 12-1, 12-2, ---, 12-n.

Each of the memory cells MC includes first and second CMOS inverters IN1 and IN2 and two transfer P-channel MOS transistors T5 and T6. The first CMOS inverter IN1 includes a driving N-channel MOS transistor T1 and a load P-channel MOS transistor T3. The source and back-gate of the MOS transistor T1 are connected to a common source wiring 14-k, the drain thereof is connected to the drain of the MOS transistor T3 and the gate thereof is connected to the gate of the MOS transistor T3. The source of the MOS transistor T3 is connected to a power source Vcc. Likewise, the second CMOS inverter IN2 includes a driving N-channel MOS transistor T2 and a load P-channel MOS transistor T4. The source and back-gate of the MOS transistor T2 are connected to the common source wiring 14-k, the drain thereof is connected to the drain of the MOS transistor T4 and the gate thereof is connected to the gate of the MOS transistor T4. The source of the MOS transistor T4 is connected to the power source Vcc. The output terminal and input terminal of the first CMOS inverter IN1 are respectively connected to the input terminal and output terminal of the second CMOS inverter IN2 so as to form a flip-flop FF. The current path of the transfer MOS transistor T5 is connected between the output terminal of the first CMOS inverter IN1 and a bit line BL. Likewise, the current path of the transfer MOS transistor T6 is connected between the output terminal of the second CMOS inverter IN2 and a bit line $\overline{BL}$. Further, the gates of the transfer MOS transistors T5 and T6 are connected to a word line WL.

The sources of the driving N-channel MOS transistors T1 and T2 in each of the memory cells MC on the same row are connected to a corresponding one of the common source wirings 14-1, ---, 14-k, ---, 14-n. As shown in FIGS. 5A and 5C, since the well regions 12-1, 12-2, ---, 12-n are respectively connected to the common source wirings 14-1, ---, 14-k, ---, 14-n via the contact holes 15-1, 15-2, ---, 15-n, the back-gates of the MOS transistors T1 and T2 are connected to the same one of the common source wirings 14-1, ---, 14-k, ---, 14-n for each row in the equivalent circuit.

Switching circuits SW2-1, ---, SW2-k, ---, SW2-n are connected to one-side ends of the common source wirings 14-1, ---, 14-k, ---, 14-n. The switching circuits SW2-1, ---, SW2-k, ---, SW2-n are used to selectively supply a potential of power source Vcc or a potential of the ground terminal Vss to the common source wirings 14-1, ---, 14-k, ---, 14-n. Each of the switching circuits SW2-1, ---, SW2-k, ---, SW2-n includes P-channel MOS transistors P1 and P2, N-channel MOS transistors N1 to N3 and a fuse F. The construction of the switching circuits SW2-1, ---, SW2-k, ---, SW2-n is now explained by taking the switching circuit SW2-k as an example. The current path of the MOS transistor P1 is connected between one end of the common source wiring 14-k and the power source Vcc. Further, the current path of the N-channel MOS transistor N1 is connected between one end of the common source wiring 14-k and the ground terminal VSS. The gates of the MOS transistors P1 and N1 are connected together and the fuse F is connected between the gate common connection node A and the power source Vcc. Further, the current path or the source-drain path of the MOS transistor N3 is connected between the common connection node A and the ground terminal Vss. Further, the common connection node A is connected to the gates of the MOS transistors P2 and N2. The source and drain of the MOS transistor P2 are connected to the power source Vcc and the drain of the MOS transistor N2, respectively. The source of the MOS transistor N2 is connected to the ground terminal Vss, and the drain common connection node B of the MOS transistors P2 and N2 is connected to the gate of the MOS transistor N3. The other switching circuits have the same construction as that described above.

In a case where there is no defective memory cell in the memory cell array, all the fuses F in the switching circuits SW2-1, ---, SW2-k, ---, SW2-n are kept connected. Therefore, in this case, the connection node A is set to the potential of the power source Vcc and the MOS transistors N2 and P2 are respectively turned on and off, thereby setting the connection node B to the potential of the ground terminal Vss. At this time, the MOS transistor N3 is turned off, thereby stably keeping the potential of the common connection node A at the potential level of the power source Vcc. As a result, the MOS transistors N1 and P1 are respectively turned on and off and the common source wirings 14-1, ---, 14-k, ---, 14-n on all the rows are set to the potential of the ground terminal Vss, causing the memory device to operate normally.

In contrast, in a case where it is detected that at least one defective memory cell occurs in a row (for example, k-th row) of the memory cell array and a leak current flows therein, the fuse F in the switching circuit SW2-k on the k-th row is blown off by application of a laser beam, for example. As a result, the potential of the connection node A is lowered, and the MOS transistors P2 and N2 in the switching circuit are respectively turned on and off, setting the connection node B to the potential of the power source Vcc and the MOS transistor N3 is turned on. As a result, the connection node A is stably set at the potential of the ground terminal Vss. Therefore, the MOS transistors P1 and N1 are respectively turned on and off and the common source wiring on the row is set to the potential of the power source Vcc. As a result, since all the memory cells MC on the defective row or k-th row are completely isolated from the ground terminal Vss, flow of the leak current is prevented. Further, the defective bit is relieved by replacing the defective row (k-th row) by a spare row which is previously prepared.

The switching circuits SW2-1, ---, SW2-k, ---, SW2-n are provided to prevent problems from occurring in a case where the common source wiring 14-1, ---, 14-k, ---, or 14-n connected to well regions 12-1, 12-2, ---, or 12-n on a row in which the leak current flows is set in the electrically floating state. However, if no problem occurs even in the above case, it is possible to provide only fuses F as the switching circuits SW2-1, ---, SW2-k, ---, SW2-n as shown in FIG. 8 in the same manner as in the second embodiment.

In the memory cell array shown in FIG. 8, if there is no defective row, all the fuses F are kept connected and the common source wirings 14-1, ---, 14-k, ---, 14-n on all the rows are kept at the potential of the ground terminal Vss. In contrast, if it is detected that a defective memory cell occurs and a leak current flows in a row, for example, a laser beam is applied to blow off the fuse F. As a result, since all the memory cells MC connected to the defective row in which the fuse F is blown off are completely separated from the ground terminal Vss, no leak current flows in the defective row.

Figure 9B:
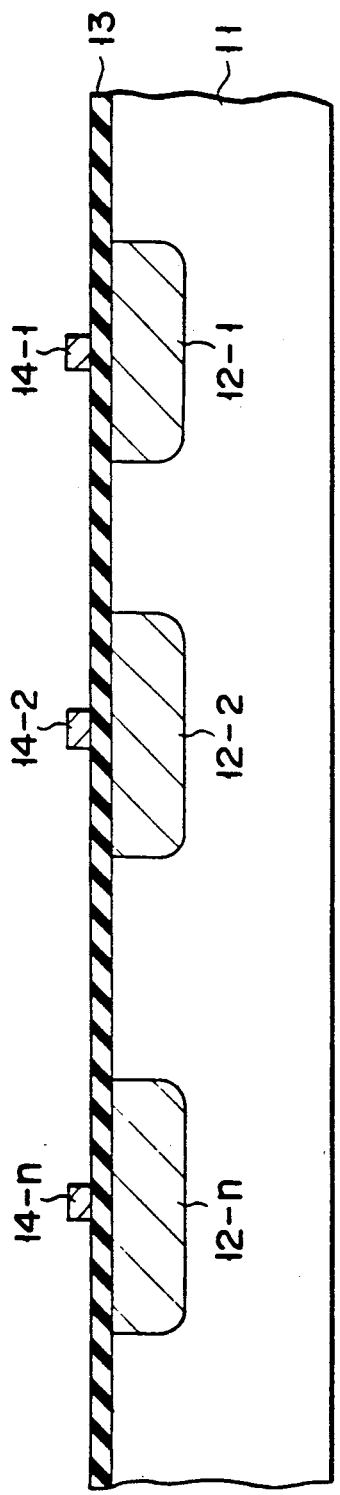
FIG. 9B is a cross sectional view taken along line X—X' of the pattern shown in FIG. 9A.
Figure 9C:
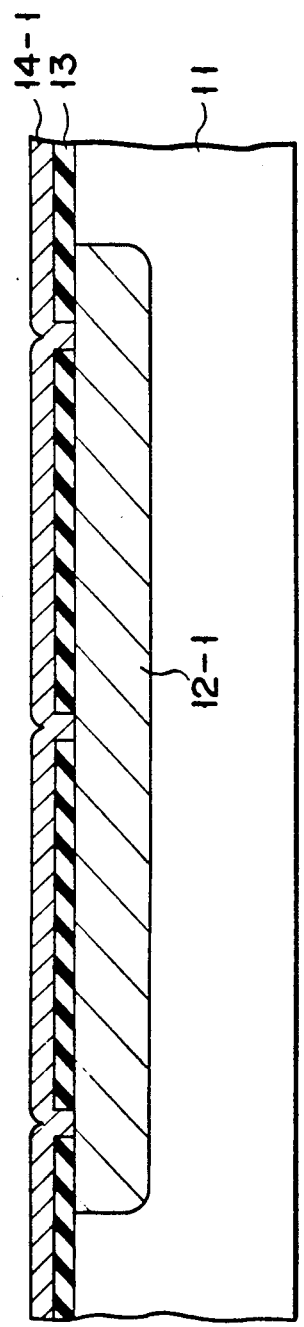
FIG. 9C is a cross sectional view taken along line Y—Y' of the pattern shown in FIG. 9A.

Further, in the above embodiments, the well regions are independently formed for each row of the memory cell array, but the well regions 12-1, 12-2, --- can be formed for every two or more rows (in this example, every two rows) of the memory cell array as shown in FIGS. 9A to 9C. In this case, MOS transistors T3 and T4 or MOS transistors T1, T2, T5 and T6 of the memory cells on corresponding two or more rows are formed in each of the well regions 12-1, 12-2, ---. Common source wirings 14-1, 14-2, --- are connected to the respective well regions 12-1, 12-2, --- and the sources of the MOS transistors formed in the respective well regions. One-side ends of the common source wirings 14-1, 14-2, --- are connected to switching circuits as described in the above embodiments with the conductivity types of the semiconductor substrate 11 and the well regions 12-1, 12-2, --- taken into consideration.

FIG. 10A shows the pattern construction of the memory cells MC of 2 rows × 2 columns included in the pattern shown in FIG. 9A. FIG. 10B is a cross sectional view taken along line Z—Z' of FIG. 10A. In FIGS. 10A and 10B, WL1 denotes a word line of the first row, WL2 denotes a word line of the second row, BLC denotes a contact portion of the bit line BL, VssC denotes a contact portion of the Vss line, 12-1 denotes an N-well region which is commonly used for the first and second rows, 14-1 denotes a common source wiring, and MC denotes memory cells. In each of the memory cells MC, Gn denotes the gate region of an N-channel MOS transistor, DCn denotes the drain contact portion of the N-channel MOS transistor, LG denotes a gate wiring of the CMOS inverter, Gp denotes the gate region of a P-channel MOS transistor and DCp denotes the drain contact portion of the P-channel MOS transistor.

With the above construction, the same effect as that obtained in the former embodiments can be attained. Further, since the number of the switching circuits and common source wirings can be reduced, higher integration density can be attained.

As described above, according to this invention, a semiconductor memory device can be provided in which even if the leak current occurring in the defective bit may flow in the current paths including the leak current path associated with the well region, the leak current occurring in the defective bit can be completely interrupted, and the manufacturing yield can be significantly enhanced by replacing the defective bit b a spare bit to relieve the defective bit.

What is claimed is:

1. A semiconductor memory device comprising:
a semiconductor substrate of a first conductivity type;
a plurality of well regions of a second conductivity type which are independently formed in said semiconductor substrate;
a memory cell array having a plurality of memory cells each formed of a MOS transistor of the first conductivity type and a MOS transistor of the second conductivity type and arranged in an array form; said MOS transistors of the first conductivity type in each row being formed in a corresponding one of said plurality of well regions and said MOS transistors of the second conductivity type being formed in said semiconductor substrate;
a plurality of common source wirings respectively connected to said plurality of well regions and each connected commonly to sources of those of the MOS transistors of the first conductivity type which are formed in a corresponding one of said plurality of well regions; and
switching means for selectively supplying one of a power source potential and a potential of said semiconductor substrate to said common source wiring, said switching means supplying the power source potential to a well region on a row having no defective memory cell and supply the potential of said semiconductor substrate to a well region on a row having a defective memory cell.

2. A semiconductor memory device according to claim 1, wherein said memory cell array includes a static memory cell.

3. A semiconductor memory device according to claim 2, wherein said static memory cell includes a first CMOS inverter having input and output terminals; a second CMOS inverter having input and output terminals respectively connected to the output and input terminals of said first CMOS inverter; a first transfer MOS transistor whose current path is connected between a first bit line of a pair of bit lines and the output terminal of said first CMOS inverter and whose gate is connected to a word line; and a second transfer MOS transistor whose current path is connected between a second bit line of said pair of bit lines and the output terminal of said second CMOS inverter and whose gate is connected to said word line.

4. A semiconductor memory device according to claim 1, wherein said switching means includes a plurality of switching circuits respectively connected to said plurality of common source wirings, each of said switching circuits including a first MOS transistor of the first conductivity type whose current path is connected between a corresponding one of said common source wirings and a power source terminal; a second MOS transistor of the second conductivity type whose current path is connected between said corresponding one of said common source wirings and a ground terminal and whose gate is connected to the gate of said first MOS transistor; a CMOS inverter having an output terminal connected to the gates of said first and second MOS transistors; a third MOS transistor of the second conductivity type whose current path is connected between the input terminal of said CMOS inverter and said ground terminal and whose gate is connected to the output terminal of said CMOS inverter; and a fuse connected between the input terminal of said CMOS inverter and said power source terminal.

5. A semiconductor memory device according to claim 1, wherein said switching means includes a plurality of switching circuits respectively connected to said plurality of common source wirings, each of said switching circuits including a first MOS transistor of the first conductivity type whose current path is connected between a corresponding one of said common source wirings and a power source terminal; a second MOS transistor of the second conductivity type whose current path is connected between said corresponding one of said common source wirings and a ground terminal and whose gate is connected to the gate of said first MOS transistor; a fuse connected between a gate common connection node between the gates of said first and second MOS transistors and said power source terminal; a third MOS transistor of the second conductivity type whose current path is connected between said gate common connection node and said ground terminal; and a CMOS inverter having an input terminal connected to said gate common connection node and an output terminal connected to the gate of said third MOS transistor.

6. A semiconductor memory device comprising:
a semiconductor substrate of a first conductivity type;
a plurality of well regions of a second conductivity type which are independently formed in said semiconductor substrate;
a memory cell array having a plurality of memory cells each formed of MOS transistors of the first conductivity type and MOS transistors of the second conductivity type and arranged in an array form, said MOS transistors of the first conductivity type of a plurality of rows being formed in a corresponding one of said plurality of well regions and said MOS transistors of the second conductivity type being formed in said semiconductor substrate;
a plurality of common source wirings respectively connected to said plurality of well regions and each connected commonly to sources of those of the MOS transistors of the first conductivity type which are formed in a corresponding one of said plurality of well regions; and
switching means for selectively supplying one of a power source potential and a potential of said semiconductor substrate to said common source wiring, said switching means supplying the power source potential to at least one of said plurality of well regions on a row having no defective memory cell and supplying the potential of said semiconductor substrate to the well region, at least one of said plurality of well regions on a row having a defective memory cell.

7. A semiconductor memory device according to claim 12, wherein said memory cell array includes a static memory cell.

8. A semiconductor memory device according to claim 7, wherein said static memory cell includes a first CMOS inverter having input and output terminals; a second CMOS inverter having input and output terminals respectively connected to the output and input terminals of said first CMOS inverter; a first transfer MOS transistor whose current path is connected between a first bit line of a pair of bit lines and the output terminal of said first CMOS inverter and whose gate is connected to a word line; and a second transfer MOS transistor whose current path is connected between a second bit line of said pair of bit lines and the output terminal of said second CMOS inverter and whose gate is connected to said word line.

9. A semiconductor memory device according to claim 6, wherein said switching means includes a plurality of switching circuits respectively connected to said plurality of common source wirings, each of said switching circuits including a first MOS transistor of the second conductivity type whose current path is connected between a corresponding one of said common source wirings and a power source terminal; a second MOS transistor of the first conductivity type whose current path is connected between said corresponding one of said common source wirings and a ground terminal and whose gate is connected to the gate of said first MOS transistor; a CMOS inverter having an output terminal connected to the gates of said first and second MOS transistors; a third MOS transistor of the first conductivity type whose current path is connected between the input terminal of said CMOS inverter and said ground terminal and whose gate is connected to the output terminal of said CMOS inverter; and a fuse connected between the input terminal of said CMOS inverter and said power source terminal.

10. A semiconductor memory device according to claim 6, wherein said switching means includes a plurality of switching circuits respectively connected to said plurality of common source wirings, each of said switching circuits including a first MOS transistor of the first conductivity type whose current path is connected between a corresponding one of said common source wirings and a power source terminal; a second MOS transistor of the second conductivity type whose current path is connected between said corresponding one of said common source wirings and a ground terminal and whose gate is connected to the gate of said first MOS transistor; a fuse connected between a gate common connection node between the gates of said first and second MOS transistors and said power source terminal; a third MOS transistor of the second conductivity type whose current path is connected between said gate common connection node and said ground terminal; and a CMOS inverter having an input terminal connected to said gate common connection node and an output terminal connected to the gate of said third MOS transistor.

* * * * *